United States Patent
Clevenger et al.

(12) 
(10) Patent No.: US 6,255,712 B1
(45) Date of Patent: Jul. 3, 2001

(54) SEMI-SACRIFICIAL DIAMOND FOR AIR DIELECTRIC FORMATION

(75) Inventors: Lawrence A Clevenger, La Grangeville; Louis L. Hsu, Fishkill, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/374,839

(22) Filed: Aug. 14, 1999

(51) Int. Cl.$^7$ .................................................... H01L 29/00
(52) U.S. Cl. .......................... 257/522; 257/758; 257/276; 257/776
(58) Field of Search .................................. 438/622, 619, 438/627, 628, 639, 702, 970; 257/522, 276, 774, 776, 644, 650, 508, 758

(56) References Cited

U.S. PATENT DOCUMENTS

| | | | |
|---|---|---|---|
| 5,444,015 | 8/1995 | Aitken et al. | 437/182 |
| 5,789,559 | 8/1998 | Bothra et al. | 257/522 |
| 5,828,121 | 10/1998 | Lur et al. | 257/522 |
| 6,016,000 | * 1/2000 | Moslehi | 257/522 |

FOREIGN PATENT DOCUMENTS

| | | | | |
|---|---|---|---|---|
| 0550910A1 | * | 7/1993 | (EP) | H01L/23/64 |
| 2330001A | * | 4/1999 | (GB) | . |
| 411163523A | * | 6/1999 | (JP) | H01L/23/12 |

OTHER PUBLICATIONS

Kohl et al. "Air Gaps for Electrical Interconnections", Electrochemical and Solid State Letters 1(1), 1998, pp. 49–51.

Singer "Technology News", Semiconductor International, Mar. 1999, p. 38.

Shieh et al. "Air gaps lower k of interconnect dielectric", Solid State Technology, 2/99, pp. 51,52, 54, 57 & 58.

* cited by examiner

Primary Examiner—Caridad Everhart
Assistant Examiner—Igwe U. Anya
(74) Attorney, Agent, or Firm—Judith D. Olsen

(57) ABSTRACT

Disclosed is a structure and process for incorporating air or other gas as a permanent dielectric medium in a multilevel chip by providing CVD diamond as a semi-sacrificial inter-level and intralevel dielectric material. The semi-sacrificial dielectric is subsequently at least partially removed in an isotopic oxygen etch. A variation of the disclosure includes providing a final, permanent CVD diamond encapsulant to contain the gaseous dielectric medium within the chip.

16 Claims, 3 Drawing Sheets

SEMI-SACRIFICIAL DIAMOND FOR AIR DIELECTRIC FORMATION

BACKGROUND OF THE INVENTION

1. Field of the Invention

This invention relates to high density integrated circuit (IC) devices. More particularly, this invention relates to very high density multilevel interconnect electronic structures, and processes of fabricating such structures, which are comprised of alternating via levels and wiring levels embedded in a gas dielectric medium, suitable for mounting on carriers such as multichip modules.

2. Background Art

The continuing drive toward reduction in dimensions and increase in the number and density of components within IC chips is inspired by increasingly more aggressive requirements of memory and logic. Smaller chip features provide higher bit density, lower operating voltages, lower energy consumption and faster device speed. Increased also are problems associated advanced IC miniaturization and the attendant closer proximity of circuit features to one another, including risk of shorting, crosstalk and capacitative coupling, among others. The highly dense integrated circuits of the future will require even narrower and longer conductor lines, tighter pitch via interconnects and lower dielectric constant values for the insulating medium, especially in the wiring levels. The lower the dielectric constant of the insulating medium, the faster the circuit speed.

As the design demands for the CMOS IC in particular become more aggressive, the need to reduce the dielectric constant of the insulating medium to a value closer to the ideal value of air, 1.0, becomes a necessity. Attempts have been described in the art to incorporate air into a solid dielectric matrix, as in the form of foam or microspheres. More recently, attention has turned to the possibility of employing air alone or some other gas as the dielectric medium in at least one level.

U.S. Pat. No. 5,789,559 issued Aug. 25, 1998 to Subhas Bothra and Liang Q. Qian describes the formation of air dielectric between metallization layers as a result of the removal of a temporary solid dielectric material by a liquid etchant, buffered hydrofluoric acid (BHF).

An article on pages 575–585 of the IBM Journal of Research and Development, Volume 42, No. Sep. 5, 1998, "Electrochemical processes for advanced package fabrication", coauthored by S. Krongelb, J. A. Tornello and L. T. Romankiw includes a description of a multilevel interconnect IC in which polyimide functions as a temporary dielectric. The polyimide was removed by ashing in an oxygen-containing plasma. The IC chip also includes copper wiring, which was plated.

An article on pages 49–51 of the journal Electrochemical and Solid State Letters, published by the Electrochemical Society, Inc. 1(1), 1998, "Air Gaps for Electrical Interconnections", coauthored by Paul L. Kohl, Qiang Zhao, Kaushal Patel, Douglas Schmidt, Sue Ann Bidstrup-Allen, Robert Shick and S. Jayaraman describes the removal of a sacrificial polymer by thermal decomposition within an encapsulated chip. The byproducts escape by diffusing through the encapsulant.

In the Technology News column on page 38 of the March 1999 edition of the journal Semiconductor International, Editor-in-Chief Peter Singer describes Toshiba's use of carbon dioxide gas dielectric in the wiring levels of an IC. The carbon dioxide is formed when the layer of carbon, which has been sputtered, is heated at 450 degrees C. in an oxygen atmosphere, resulting in the diffusion of oxygen to the carbon, where they combine to form $CO_2$.

An article on pages 51, 52, 54, 57, and 58 of the February, 1999 issue of the journal Solid State Technology, "Air gaps lower k of interconnect dielectric", coauthors Ben Shieh, Krishna Saraswat, Mike Deal and Jim McVittio describe results of their modelling of air dielectric in structures having a variety of aluminum conductor line dimensions. Their simulation predicts a 40%–50% reduction in capacitance due to the air dielectric.

In the present invention, wet processing can be limited to photolithographic processes, such as resist removal, which are conventionally used successfully and without contaminating the IC structure. Rather than using aggressive solvents to remove a temporary, sacrificial dielectric material, an isotropic oxygen etch is used to remove the sacrificial dielectric material cleanly. Where a electroplating can be used to deposit such metals as copper and gold for wiring and interconnect vias in the present invention, dry deposition is preferred because extra steps such as those involved in establishing a barrier to electromigration of the metal into silicon are not required and because some useful metals and alloys are not amenable to plating. A wide variety of dielectric gasses can be protectively incorporated into the IC chip of the present invention. High temperature decomposition techniques play no role, nor is it necessary to fabricate passivation layers, such as on the substrate level. The present invention uniquely uses diamond-like carbon or diamond, preferably deposited by CVD, rather than, for example, a polymer or a silicon oxide as the temporary, sacrificial dielectric layer material. Since CVD diamond is a stronger material than polyimide or other dielectric polymer, use of the CVD diamond in the present invention will facilitate planarization by chemical-mechanical polishing (CMP). CVD diamond has the further advantage superior ability to conduct heat away from the IC chip which it encloses, in particular when a limited amount of CVD diamond is permitted to remain within the fabricated structure.

The present invention includes the removal of sacrificial CVD diamond in a gas etchant, leaving gas-filled gaps to function as the permanent dielectric medium in, for example, a CMOS IC, a procedure not described in the art. The process of the present invention avoids any attack on or contamination of the elements of the IC structure and obviates any need to protect the gate level substrate by passivation, allowing the gate level the benefit of the low dielectric gas medium and avoiding passivation steps. Furthermore the present invention describes a means of encapsulating the gas dielectric and an encapsulated CMOS IC not found in the art. The encapsulant eliminates diffusion of moisture or impurities into the encapsulated structure and confines the gas within. Several different gases can be used as alternative permanent dielectric media. These and other advantages and distinctions will be more fully evident infra.

SUMMARY OF THE INVENTION

It is therefore an object of the invention to provide a multilevel interconnect CMOS IC chip having a gas insulating medium whose dielectric constant approaches or equals the ideal value of air.

It is a further object of the invention to employ a CVD diamond sacrificial dielectric in conjunction with removal of the sacrificial dielectric by an isotropic oxygen etch to produce a very low-k IC chip.

It is a further object of the invention to provide an encapsulated multilevel interconnect CMOS IC chip having a gas insulating medium which is protected from exchange of material with the external ambient and away from which heat is readily conducted.

It is a further object in an alternative mode of the invention to permit CVD diamond to remain in selected areas of the chip in order to provide additional structural support and thermal conductivity.

It is a further object in an alternate mode of the invention to provide strategically located support structure in the form of pillars or studs in the process of forming an encapsulated structure.

These and other objects are achieved according to the present invention in which, except for standard photolithographic steps, dry processing steps produce a high density CMOS IC which includes a gaseous dielectric medium interlevel and intralevel. The fabrication of the IC involves first including diamond-like carbon (DLC), diamond or preferably CVD diamond as a sacrificial dielectric material. Upon completion of the chip, prior to the deposition of final encapsulant, the sacrificial dielectric is removed harmlessly and selectively through openings in a hard mask top coat using an isotopic oxygen etch. Without compromising the electrical or mechanical integrity of the chip structure, the removal of the temporary, sacrificial dielectric material leaves behind regions in the structure which are filled with a permanent, gas dielectric medium. The sacrificial dielectric medium is also referred to herein as semi-sacrificial, as it is not necessarily the case that all of it must or should be removed from a particular IC configuration, since the dielectric constant of CVD diamond is known to be low at a value of about two.

In an embodiment of the present invention, the high density CMOS IC is sealed off from the ambient by an encapsulant. The seal assures a stable gaseous dielectric environment comprising such gases as air, $CO_2$, nitrogen, inert gasses such as argon, helium, or others, and mixtures thereof. The encapsulant may also be controllably deposited in selected dielectric regions within the structure for additional mechanical support, leaving the remaining dielectric regions occupied by the air or other gas.

BRIEF DESCRIPTION OF THE DRAWINGS

FIG. 1 represents a cross-sectional view of the substrate level of a CMOS chip structure after devices and isolation regions have been formed.

FIG. 2 represents the level shown in FIG. 1 after a first sacrificial dielectric layer has been deposited between the gates and planarized, and a first hard mask has been deposited overall.

FIG. 3 represents the structure shown in FIG. 2 after the hard mask has been selectively provided with openings and the sacrificial dielectric has been selectively etched and filled to form conductive vias. The remaining hard mask has been removed.

FIG. 4 represents the structure shown in FIG. 3 on which a second sacrificial dielectric layer has been deposited, selectively etched, and filled to form conductive vias at preselected locations.

FIG. 5 represents the structure shown in FIG. 4 on which a second sacrificial dielectric layer has been deposited, selectively etched, and filled to form a first local interconnect conductive wiring level in electrical communication with selected conductive vias that were formed in FIG. 4. In addition a third and a fourth level of CVD diamond and a first wiring level have been deposited, selectively etched to form vias and wiring.

FIG. 6 represents the structure shown in FIG. 5 on which a final conductive via level, then a second wiring level have been formed in a sacrificial dielectric medium as described for preceding figures. A final hard mask has been deposited overall and after formation of the second wiring level.

Figures 5, 6, 7:
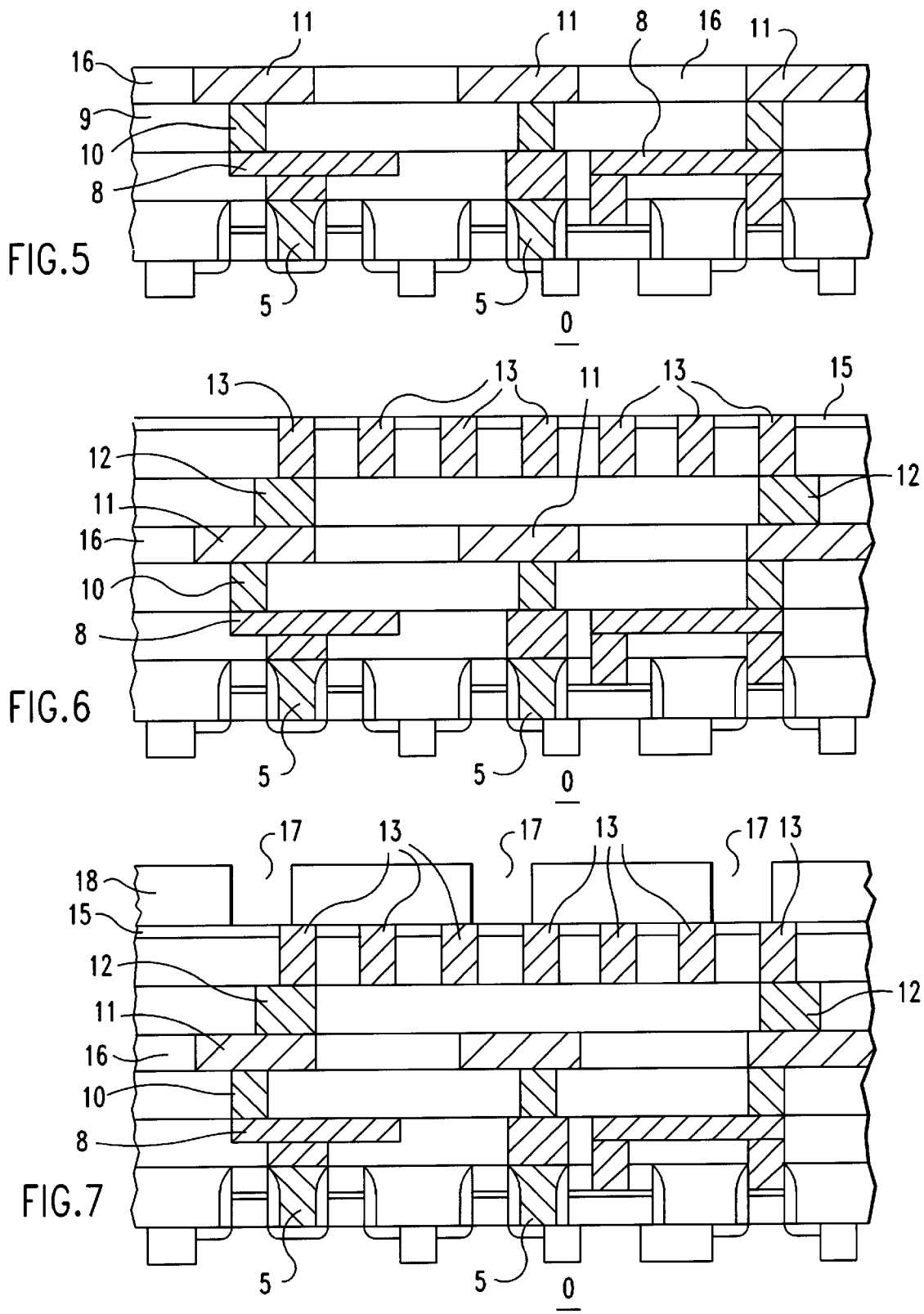

In the FIG. 7 representation, photoresist has been applied onto the final hard mask and openings have been patterned.

Figure 8:
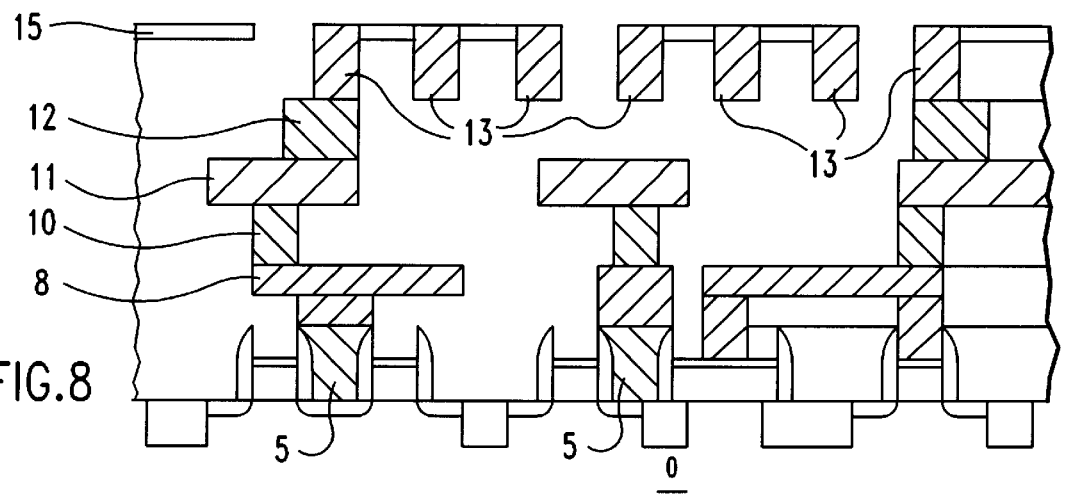

In the FIG. 8 representation, all the sacrificial dielectric has been removed from the structure through the openings patterned in the final hard mask.

FIGS. 1–9 represent a second embodiment of the present invention.

Figure 9:
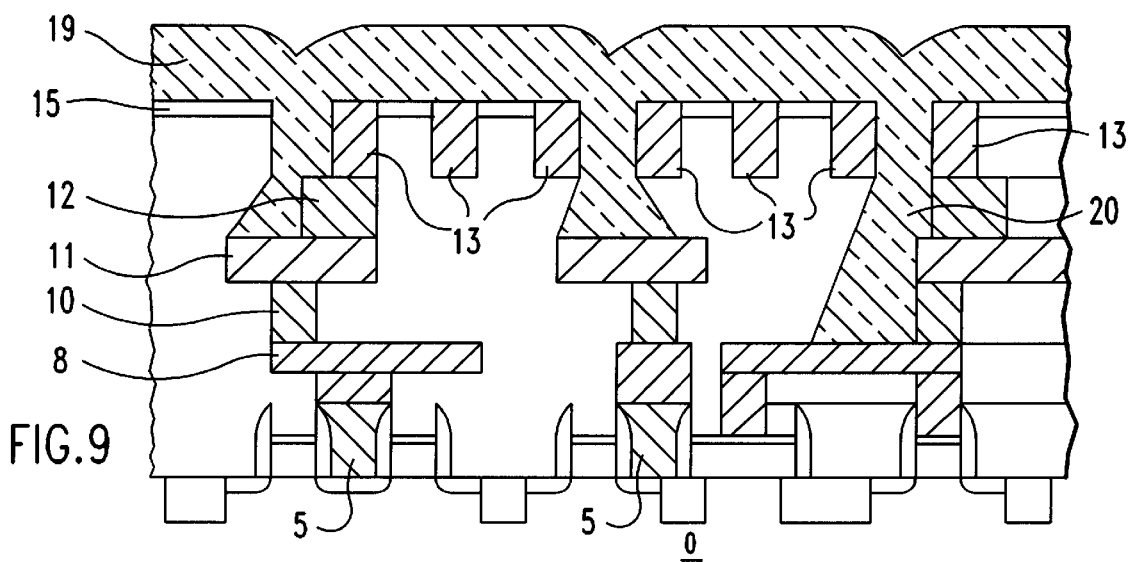

In the FIG. 9 representation, CVD diamond has been deposited as an encapsulant onto the FIG. 8 structure, sealing the lower interconnection levels from the external ambient and providing strengthening columns.

FIGS. 1–7 and 10 represent a third embodiment of the present invention.

Figure 10:
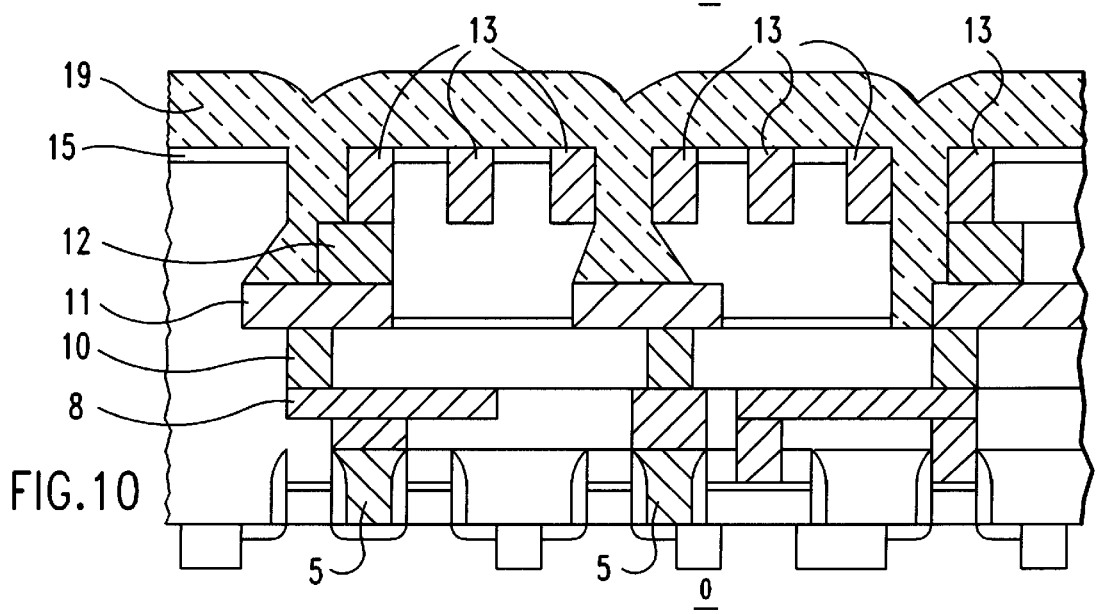

In the FIG. 10 representation, CVD diamond has only been removed from areas with high device, line or via packing density, limiting gas dielectric to those specific areas.

DESCRIPTION OF THE PREFERRED AND VARIOUS EMBODIMENTS

In order to facilitate understanding of the present invention, reference is made to the following detailed description taken in conjunction with the drawings.

In one exemplary embodiment of the present invention, CVD diamond is deposited as a temporary, sacrificial dielectric medium in the electrically interconnected levels of a CMOS IC chip structure. The CVD diamond gives stability to the structure as it is being fabricated, but is no longer needed when the structure is completed. It is then removed from the entire structure by an isotropic oxygen etch through the openings in a nitride hard mask overlayer which have been defined by photolithography. The hard mask is left in place for stability.

Figure 1:
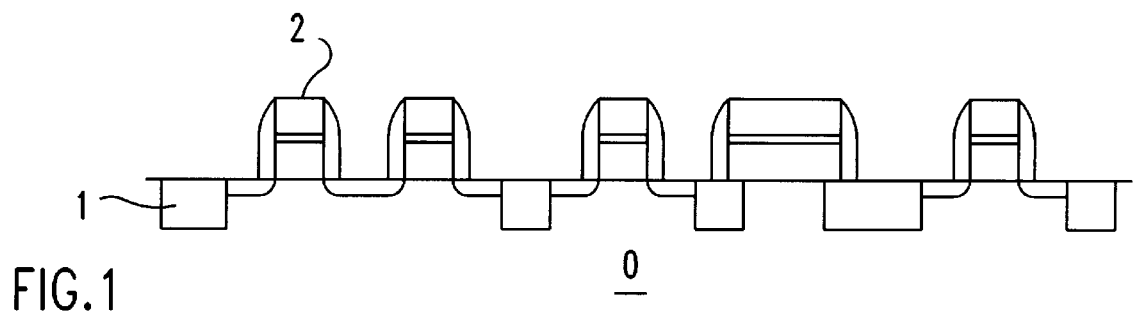
FIGS. 1–8 represent one embodiment of the present invention.

FIG. 1 illustrates an example of the starting point of the present invention as applied to a CMOS BEOL chip. The substrate (0) material can be silicon, a silicon oxide, silicon/germanium, gallium arsenide or any such semiconductor. Oxide isolation regions (1) are shown below substrate (0) and gates (2) are shown atop the substrate (0). Not shown but potentially also disposed atop substrate (0) are metallization, such as wiring, and additional devices.

Figure 2:
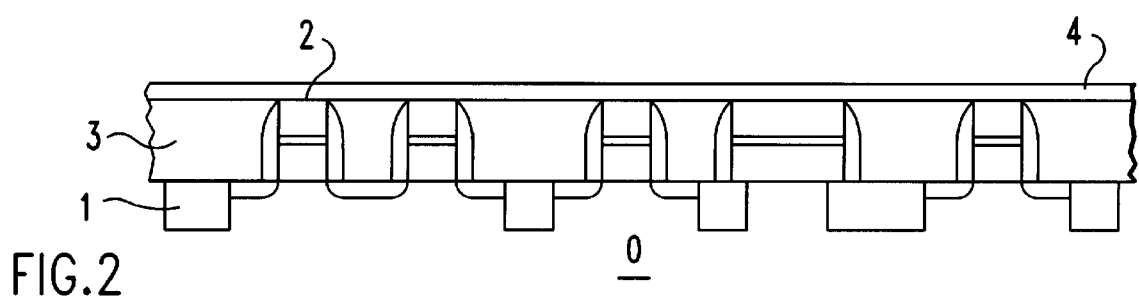

In FIG. 2, CVD diamond, the temporary, sacrificial dielectric medium (3), is deposited onto the FIG. 1 structure by chemical vapor deposition (CVD) and planarized. Whether or not planarization is necessary after deposition of CVD diamond depends upon the demands of the integration scheme. Planarization can be performed by etch-back or CMP. A hard mask (4) is deposited onto the planarized CVD diamond (3). The hard mask (4) may be comprised of a silicon oxide, silicon nitride, or the like which can be deposited by sputtering or CVD. In this case the hard mask (4) is a nitride.

Figure 3:
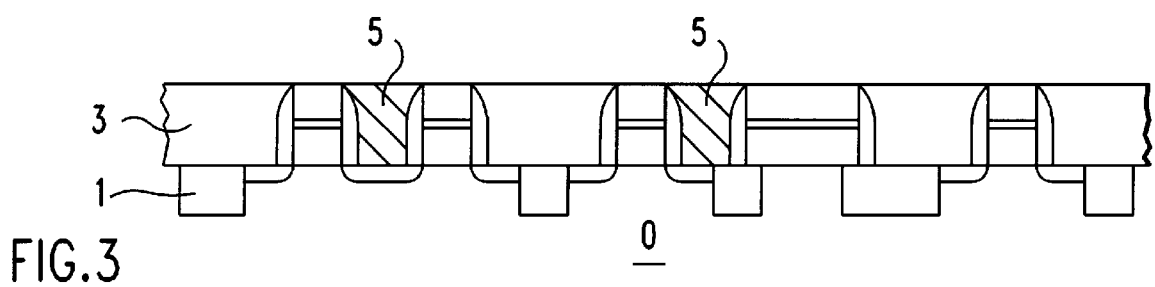

In a step not shown, standard photolithography procedures have been followed to expose openings in the hard mask (4) which have been isotropically oxygen etched through the CVD diamond (3) in order to provide openings for the deposition of metal to form conductive studs, also called vias (5), shown in FIG. 3.

Figure 4:
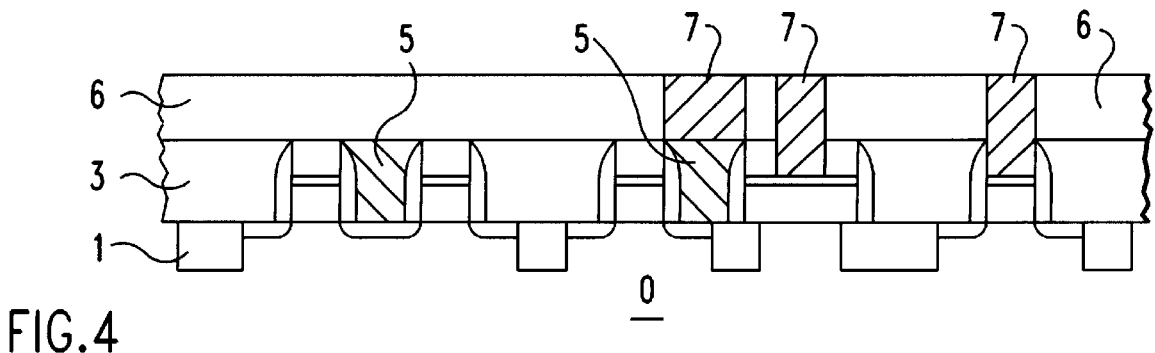

As FIG. 4 shows, vias (5) have been filled with conductor, hard mask (4) is completely etched away and a second layer of sacrificial CVD diamond (6) is deposited and coated with a hard mask (not shown). The hard mask (not shown) is provided with openings using standard photolithographic techniques followed by oxygen etch through the openings and the underlying CVD diamond. The openings are filled with conductor to make vias (7) connecting to selected gates and other vias and the remaining hard mask (not shown) is oxygen etched away. A second Damascene process can be carried out using the same diamond dielectric layer (6) to form local interconnect (8), shown in FIG. 5.

Several steps not shown have occurred between the fabrication of the structure shown in FIG. 4 and that shown in FIG. 5. However, the procedures are substantially the same as those described in relation to FIGS. 2–4 above: a CVD diamond layer (9) is deposited atop vias (7) and local interconnect (8), hard mask (not shown) is deposited followed by photolithography and oxygen etching of openings in the mask (not shown) and underlying CVD diamond (not shown), conductor is deposited to form vias (10), remaining etch mask (not shown) is removed and additional CVD diamond (16) is deposited. Again, a hard mask (not shown) is subjected to photolithography, openings are oxygen etched through the openings and CVD diamond layer (16), and first wiring level (11) is deposited.

In like manner second via level (12) is fabricated, as is second wiring level (13). FIG. 6 includes the final level. The final hard mask (15) is not removed but is left to contribute to support of the structure when the sacrificial CVD diamond dielectric is removed. In fact, hard mask (15) may provide sufficient support if there are not too many additional levels fabricated. At the completion of wiring level (13) and prior to the application of final hard mask (15) when the first and second via levels and the first and second wiring levels have been completed, additional alternating wiring and via levels can be fabricated in the same manner as before, the number of levels depending on the requirements of the device on which the chip is to be mounted. In the interest of brevity, however, additional levels are not shown.

As shown in FIG. 7, photoresist (18) is applied to final hard mask (15) and cured, openings (17) are exposed and developed in resist (18) and oxygen etched through hard mask (15). As shown in FIG. 8, the unexposed region of photoresist (18) is removed and openings (17) in mask (15) provide access for the removal of all sacrificial dielectric from the structure by isotropic oxygen etch.

FIGS. 1–8 described above combined with FIG. 9 represent a second embodiment of the present invention. When steps 1–8 are completed, A permanent cap of CVD diamond (19) is deposited onto the chip as represented in FIG. 9. The CVD diamond of the cap (19) is also deposited into the chip structure through the openings (17) in the hard mask (15), selectively sealing off lower interconnection levels from the ambient external to the chip. What is not shown is that by choice of layout the sides of the chip are also sealed. If the CVD diamond cap (19) is deposited in the atmosphere of an inert gas, such as argon or helium, that gas will be sealed within the chip rather than another. A sealed structure provides a more consistent dielectric medium by preventing the introduction of contaminants such as dirt of moisture from outside. The CVD diamond cap (19) also provides improved thermal conductivity, a factor which becomes more important as the structure becomes more complex and increased heat is generated during use. Openings (17) in hard mask (15) shown in FIG. 8 provide sufficient access to remove CVD diamond from within the chip, but the deposition of cap (19) into the same openings (17) forms columns (20) which block openings (17) and whose vertical progression into the chip is limited by features (11), and (8).

FIGS. 1–7 described above combined with FIG. 10 represent a third embodiment of the present invention.

In the third embodiment of the present invention the steps represented in FIGS. 1–7 have been completed and openings (17) formed as shown in FIG. 8. Rather than removing all CVD diamond from horizontal levels in the structure as shown in FIG. 8, however, the diamond is incompletely etched out from the lower levels of the chip, leaving some remaining in regions of relatively lower pattern density. In FIG. 10, CVD diamond levels 16 and below are shown to be incompletely etched out. A partial removal provides improved mechanical stability and thermal conductivity, especially in structures having many levels, while maintaining the benefit of low dielectric air gaps in regions of relatively higher pattern density at the upper levels as shown in FIG. 10. The intent is to have diamond in those areas where more mechanical support to the structure is required and to have air dielectric in those areas where very low dielectric constant is required.

Although most of the description of the present invention has been presented in terms of using diamond, particularly CVD diamond, or DLC as a sacrificial dielectric, the above examples are intended to be illusive rather than exhaustive, and while the invention has been described in conjunction with three specific embodiments, additional embodiments, modifications and applications will be apparent now and in the future to those skilled in the art.

We claim:

1. A multilevel interconnect integrate circuit chip structure comprising in at least one of the comprising CVD diamond multilevels a gaseous dielectric medium confined within the chip by a dielectric encapsulant.

2. The chip structure recited in claim 1, wherein the gaseous dielectric medium is selected from the group consisting of neon, helium, air, nitrogen, carbon dioxide and mixtures thereof.

3. The chip structure recited in claim 1, wherein the structure comprises a BEOL CMOS chip mounted on a barrier-free device level the device level including a gaseous dielectric material.

4. The chip structure recited in claim 1, comprising also at least one CVD diamond internal columnar support.

5. The chip structure recited in claim 1, including also CVD diamond as a permanent dielectric material within at least a portion of at least one level.

6. The chip structure recited in claim 5, wherein the CVD diamond permanent dielectric material within at least a portion of at least one level comprises a columnar structure extending from the CVD encapsulant down into the structure at specific locations.

7. A multilevel interconnect integrated circuit chip structure, comprising:
   a. a semiconductor substrate supporting a substrate level metallization layer defining at least one device and at least one substrate-level conductive via interconnect;
   b. a first conductive via level in electrical communication with selected ones of the at least one substrate-level conductive via interconnect and the at least one device;
   c. a local interconnect wiring level in electrical communication with selected vias in the first conductive via level;
   d. a preselected number of additional alternating conductive via levels and wiring levels in electrical communication;

e. a permanent hard mask disposed atop the final preselected level;

f. a gaseous dielectric medium within the device level and at least one additional level; and g. CVD diamond disposed as an encapsulant atop the permanent hard mask layer and disposed as a permanent dielectric material within the chip structure in at least a portion of at least one level.

8. The multilevel interconnect integrated circuit chip structure recited in claim 7, wherein the semiconductor substrate is selected from the group consisting of silicon, gallium arsenide, silicon-on-oxide, and silicon germanium.

9. The multilevel interconnect integrated circuit chip structure recited in claim 7, wherein the conductive vias and the conductive wiring are selected from the group consisting of aluminum, aluminum-copper, copper, tungsten and doped polysilicon.

10. The multilevel interconnect integrated chip structure recited in claim 7, wherein the permanent hard mask comprises a silicon oxide or nitride having at least one perforation, the number and placement of which is determined by functional requirements of the structure.

11. The multilevel interconnect integrated circuit chip structure recited in claim 7, wherein the gas dielectric medium is selected from the group consisting of air, carbon dioxide, nitrogen, helium, argon and mixtures thereof.

12. The multilevel interconnect integrated circuit chip structure recited in claim 7, comprising at least one additional via level alternating with at least one additional wiring level under the permanent hard mask.

13. The chip structure recited in claim 7, comprising also a cap and at least one internal columnar support comprised of CVD diamond.

14. The chip structure recited in claim 7, comprising also a permanent CVD diamond dielectric medium within at least one level.

15. The chip structure recited in claim 7, wherein the permanent dielectric material within the chip structure extends columnarly down into the integrated circuit chip structure through at least one discrete opening in the hard mask.

16. A multilevel interconnect integrated circuit chip structure intermediate for the formation of a chip incorporating gaseous dielectric medium, the intermediate having CVD diamond as a temporary dielectric medium in preselected locations within the chip where the gaseous dielectric medium is to be incorporated.

* * * * *

UNITED STATES PATENT AND TRADEMARK OFFICE
CERTIFICATE OF CORRECTION

PATENT NO. : 6,255,712 B1
DATED : July 3, 2001
INVENTOR(S) : Lawrence A. Clevenger and Louis L. Hsu It is certified that error appears in the above-identified patent and that said Letters Patent is hereby corrected as shown below:

<u>Title page,</u>
Item [57], ABSTRACT,
Line 6, the word "isotopic" should read -- isotropic --.

<u>Column 2,</u>
Line 18, "Where a" should read -- Whereas --.

<u>Column 3,</u>
Line 23, the word "isotopic" should read -- isotropic --.

<u>Column 6,</u>
Line 14, "16" should read -- (16) --.
Line 32, "integrate" should read -- integrated --.
Lines 33-34, move "comprising CVD diamond" to the end of Claim 1 after "encapsulant".

Signed and Sealed this

Third Day of June, 2003

JAMES E. ROGAN
*Director of the United States Patent and Trademark Office*